(12) United States Patent
Kihara et al.

(10) Patent No.: US 10,605,678 B2
(45) Date of Patent: Mar. 31, 2020

(54) PIEZOELECTRIC FILM SENSOR AND HOLDING STATE DETECTING DEVICE

(71) Applicant: Murata Manufacturing Co., Ltd., Nagaokakyo-shi, Kyoto-fu (JP)

(72) Inventors: Takashi Kihara, Nagaokakyo (JP); Yoshihiro Yamaguchi, Nagaokakyo (JP); Jun Endo, Nagaokakyo (JP); Yutaka Ishiura, Nagaokakyo (JP); Shigetoshi Hayashi, Nagaokakyo (JP); Fumiya Isono, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 275 days.

(21) Appl. No.: 15/793,194

(22) Filed: Oct. 25, 2017

(65) Prior Publication Data
US 2018/0058954 A1 Mar. 1, 2018

Related U.S. Application Data

(63) Continuation of application No. PCT/JP2016/065240, filed on May 24, 2016.

(30) Foreign Application Priority Data

May 29, 2015 (JP) .................................. 2015-109322
Sep. 11, 2015 (JP) .................................. 2015-179841

(51) Int. Cl.
*G01L 1/16* (2006.01)
*G01L 5/00* (2006.01)
(Continued)

(52) U.S. Cl.
CPC .................. *G01L 1/16* (2013.01); *G01L 5/00* (2013.01); *G01L 5/167* (2013.01); *H01L 41/042* (2013.01); *H01L 41/08* (2013.01); *H01L 41/1132* (2013.01)

(58) Field of Classification Search
CPC ... G01L 1/16; G01L 5/167; G01L 5/00; H01L 41/08; H01L 41/1131; H01L 41/042
See application file for complete search history.

(56) References Cited

U.S. PATENT DOCUMENTS 5,410,210 A   4/1995 Sato et al.
5,443,780 A *  8/1995 Matsumoto ........... B29C 55/005
                                                                  264/176.1
(Continued)

FOREIGN PATENT DOCUMENTS

JP    H06-29587 A     2/1994
JP    H06-216422 A    8/1994
(Continued)

OTHER PUBLICATIONS

International Search Report issued in International Application No. PCT/JP2016/065240, dated Aug. 23, 2016.
(Continued)

*Primary Examiner* — Jonathan M Dunlap
(74) *Attorney, Agent, or Firm* — Arent Fox LLP

(57) ABSTRACT

Disclosed is a piezoelectric film sensor including an insulating substrate having a first electrode formed on at least one main surface thereof, a piezoelectric film which has a first main surface and a second main surface and in which the first main surface is provided on the first electrode side, and a conductive thin film member provided on the second main surface side. The piezoelectric film sensor is characterized in that the first main surface is disposed on a pressing surface side.

14 Claims, 13 Drawing Sheets

(51) Int. Cl.
  *H01L 41/04* (2006.01)
  *G01L 5/16* (2020.01)
  *H01L 41/08* (2006.01)
  *H01L 41/113* (2006.01)
  *G01L 5/167* (2020.01)

(56) References Cited

U.S. PATENT DOCUMENTS

| | | | |
|---|---|---|---|
| 6,291,098 B1 * | 9/2001 | Shibuya | H01M 2/0275 429/163 |
| 8,035,906 B2 * | 10/2011 | Ashizawa | H02N 2/163 359/696 |
| 8,183,755 B2 * | 5/2012 | Bang | G02F 1/13452 313/313 |
| 8,544,337 B2 * | 10/2013 | Kuczynski | G01L 1/16 73/777 |
| 9,519,378 B2 | 12/2016 | Watazu et al. | |
| 9,739,671 B2 * | 8/2017 | Araki | G01L 1/225 |
| 10,378,973 B2 * | 8/2019 | Kihara | G06F 3/03545 |
| 2002/0045838 A1 | 4/2002 | Treppo et al. | |
| 2004/0263483 A1 | 12/2004 | Aufderheide | |
| 2009/0309477 A1 * | 12/2009 | Bang | G02F 1/13452 313/307 |
| 2010/0142064 A1 * | 6/2010 | Ashizawa | G02B 7/08 359/824 |
| 2011/0109204 A1 * | 5/2011 | Tajitsu | H01L 41/193 310/348 |
| 2011/0239790 A1 * | 10/2011 | Kuczynski | G01L 1/16 73/862.624 |
| 2013/0298988 A1 * | 11/2013 | Fukuda | H01L 31/0516 136/256 |
| 2014/0049137 A1 * | 2/2014 | Ando | G01B 7/16 310/330 |
| 2014/0331791 A1 * | 11/2014 | Ishii | G01B 7/003 73/862.625 |
| 2015/0255805 A1 * | 9/2015 | Tanaka | H01M 8/0247 429/465 |
| 2016/0018276 A1 * | 1/2016 | Araki | G01L 1/225 73/862.625 |
| 2016/0169753 A1 | 6/2016 | Kawamura | |
| 2016/0320899 A1 | 11/2016 | Watazu et al. | |
| 2017/0027544 A1 * | 2/2017 | Gemmeke | A61B 8/4494 |

FOREIGN PATENT DOCUMENTS

| | | |
|---|---|---|
| JP | 2007-521569 A * | 8/2007 |
| JP | 5689523 B1 | 3/2015 |
| WO | 2015041198 A1 | 3/2015 |

OTHER PUBLICATIONS

Written Opinion of the International Searching Authority issued in International Application No. PCT/JP2016/065240, dated Aug. 23, 2016.

* cited by examiner

PIEZOELECTRIC FILM SENSOR AND HOLDING STATE DETECTING DEVICE

CROSS REFERENCE TO RELATED APPLICATIONS

The present application is a continuation of International application No. PCT/JP2016/065240, filed May 24, 2016, which claims priority to Japanese Patent Application No. 2015-179841, filed Sep. 11, 2015 and Japanese Patent Application No. 2015-109322, filed May 29, 2015, the entire contents of each of which are incorporated herein by reference.

TECHNICAL FIELD

The present invention relates to a piezoelectric film sensor for detecting pressing and a holding state detecting device provided with the piezoelectric film sensor.

BACKGROUND ART

For a sensor using a piezoelectric film, for example, a structure as disclosed in Japanese Patent Application Laid-Open No. H6-216422 has been known. This sensor has a structure in which a central electrode layer having high rigidity is held between a pair of piezoelectric films and is further sandwiched by outer electrode layers having relatively small rigidity from the outside thereof.

The sensor disclosed in Japanese Patent Application Laid-Open No. H6-216422 deforms in a symmetrically vertical manner when a pressing force is applied to an upper or lower side surface. However, when, for example, the rigidity of the electrode layer on a pressing surface side is small, deformation due to application of the pressing force is absorbed by the electrode layer with the result that the pressing force is not always applied to the piezoelectric film. In addition, when the rigidity of the electrode layer on the side opposite to the pressing surface is large, deformation of the piezoelectric film may sometimes be hindered.

Thus, it is an object of the present invention to provide a piezoelectric film sensor capable of detecting a pressing force with high sensitivity to an object in which a direction of the pressing force is known in advance, and a holding state detecting device provided with the piezoelectric film sensor.

BRIEF SUMMARY OF THE INVENTION

In accordance with an aspect of the invention, a piezoelectric film sensor includes an insulating substrate having first and second opposed main surfaces. A first electrode is provided on at least the first main surface of the insulating substrate. A piezoelectric film having first and second opposed main surfaces is also provided with the first main surface of the piezoelectric film facing the first electrode. A conductive thin film member is provided on the second main surface of the piezoelectric film.

In one embodiment, first electrode is also located on the second main surface of the insulating substrate.

In preferred embodiments, the piezoelectric film is provided on the first electrode.

The conductive thin film member is preferably provided on the second main surface of the piezoelectric film via a first adhesive which penetrates into the conductive thin film member. It is also preferred that the first electrode is provided on the first main surface of the insulating substrate via a second adhesive which penetrates into the first electrode. It is further preferred that a third adhesive is coated onto the insulating substrate and penetrates into the conductive thin film member such that the first adhesive and the third adhesive are connected in the conductive thin film member. Finally, it is preferred that the first electrode is provided on the at first and second main surface of the insulating substrate via an adhesive which penetrates into the first electrode.

The conductive thin film member is preferably provided on the second surface of the piezoelectric film via a first adhesive which penetrates into the conductive thin film member and the first electrode is provided on the piezoelectric film via a second adhesive which penetrates into the first electrode. In addition, the piezoelectric film sensor preferably further comprises a third adhesive coated onto the insulating substrate and penetrating into the conductive thin film member such that the first adhesive and the third adhesive are connected in the conductive thin film member.

In various embodiments, at least one of the first electrode and the conductive thin film member comprises a porous material. The porous material is preferably a metal nonwoven fabric.

In embodiments, at least a portion of the first electrode is in contact with the first main surface of the piezoelectric film and a second electrode may formed on the second main surface of the insulating substrate. The conductive thin film member may be electrically connected to the second electrode.

In various preferred embodiments, the insulating substrate and the first electrode have elastic moduli higher than the elastic modulus of the conductive thin film member and the piezoelectric film comprises polylactic acid stretched in a uniaxial direction.

The invention is also directed to a holding state detecting device including a cylindrical housing and a piezoelectric film sensor as described above and coupled to an inner wall surface of the housing. A detection section determines whether the housing is held by a user based on a variation amount of an output voltage of the piezoelectric film sensor.

The detection section preferably determines whether the housing is held by a user by calculating a variation amount of the output voltage of the piezoelectric film sensor per unit time and compares the variation amount to a threshold value. After the detection section determines that the housing is held by a user, it further determines that the housing is no longer held by the user when the variation amount of the output voltage per unit time falls below the threshold level for more than a predetermined period of time.

According to the present invention, pressing can be detected with high sensitivity to an object in which a direction of applying pressing is known in advance.

DETAILED DESCRIPTION OF THE PREFERRED EMBODIMENTS

Figure 1A:
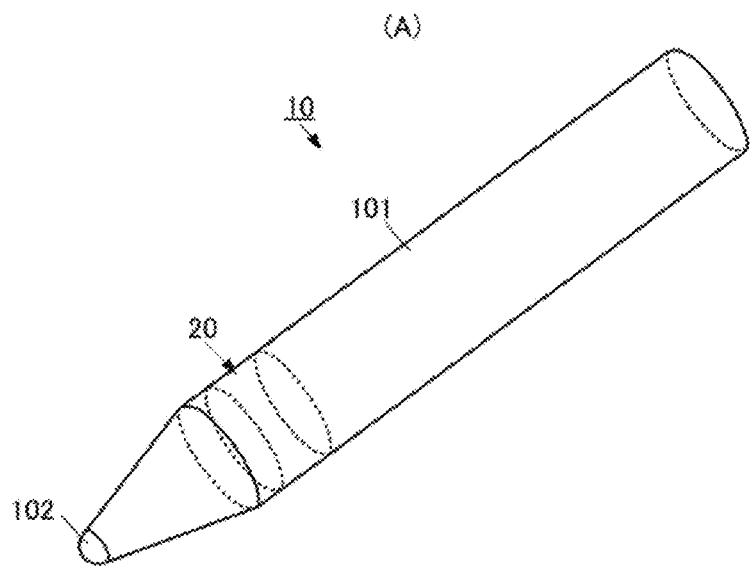
FIG. 1A is an external perspective view of an electronic pen.
Figure 1B:
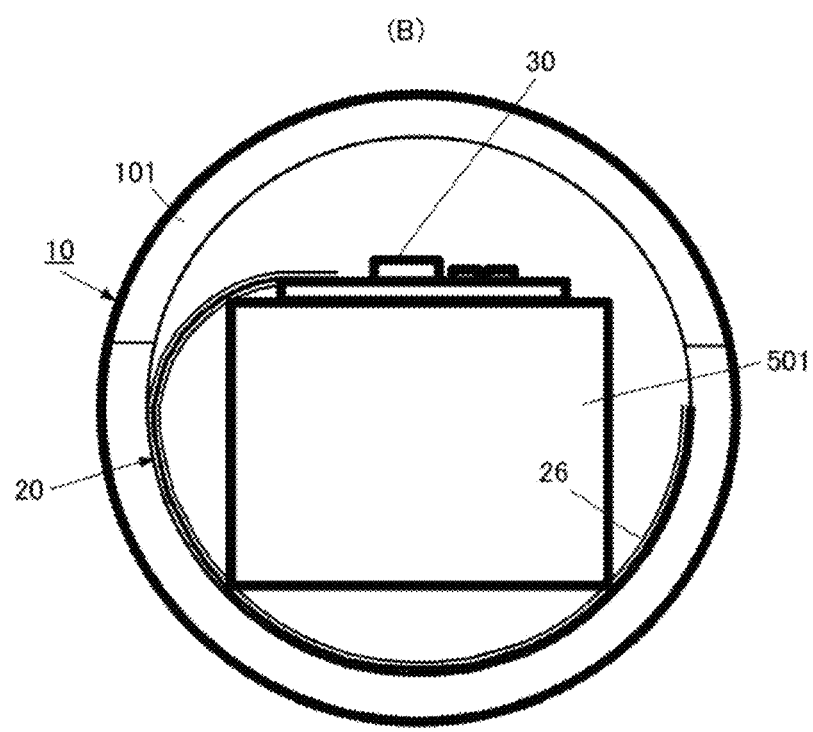
FIG. 1B is a cross-sectional view of the electronic pen.
Figure 2A:
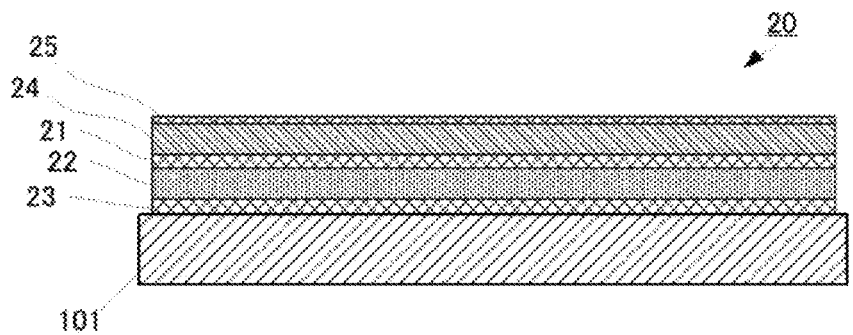
FIG. 2A is a cross-sectional view of a piezoelectric film sensor.
Figure 2B:
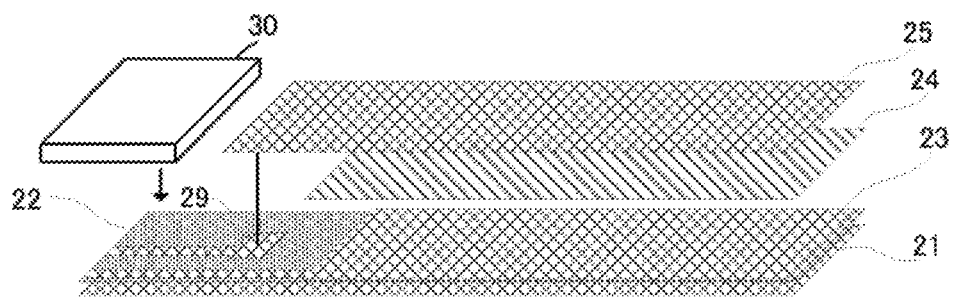
FIG. 2B is an exploded perspective view of the piezoelectric film sensor.
Figure 3:
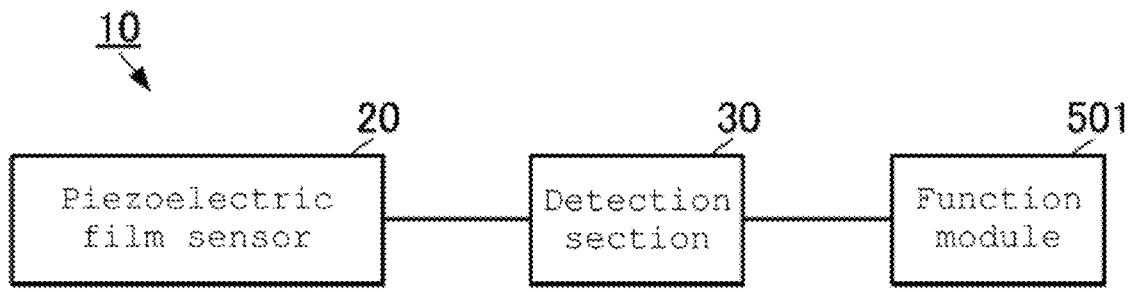
FIG. 3 is a functional block diagram of the electronic pen.

FIG. 1A is a perspective view of an electronic pen 10 provided with a piezoelectric film sensor having a structure in accordance with an embodiment of the present invention. FIG. 1B is a cross-sectional view of the electronic pen 10. FIG. 2A is a cross-sectional view showing a structure of a piezoelectric sensor 20, and FIG. 2B is an exploded perspective view. FIG. 3 is a functional block diagram of the electronic pen 10.

The electronic pen 10 has a hollow cylindrical housing 101 in which the piezoelectric sensor 20, a detection section 30, and a function module 501 are arranged. At one end of the housing 101 in the longitudinal direction (the direction orthogonal to the circumferential direction), a tapered end portion 102 is provided.

The piezoelectric sensor 20 is preferably a flexible thin film and, as shown in FIG. 1B, is preferably bent in a generally cylindrical shape to be disposed on an inner surface wall of the housing 101. The piezoelectric sensor 20 is disposed preferably along the circumferential direction on the inner wall surface of the housing 101.

Figure 2C:
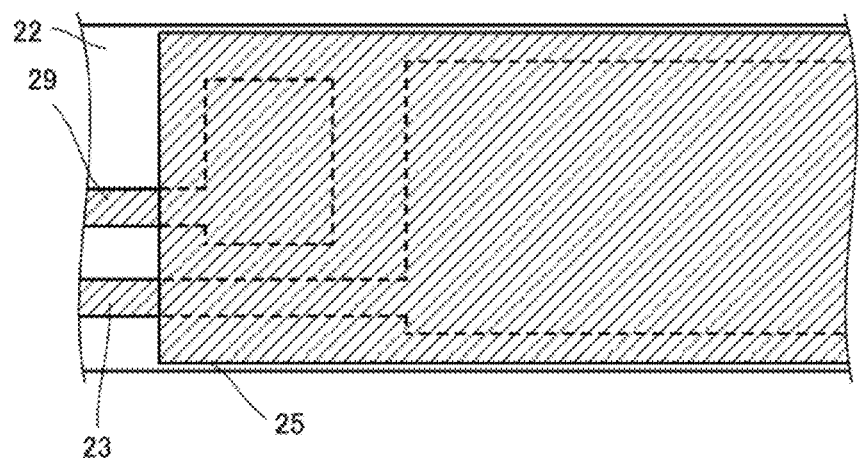
FIG. 2C is a partial plan view of the piezoelectric film sensor.

As shown in FIGS. 2A, 2B and 2C, the piezoelectric sensor 20 (shown laid flat in the figures) includes a first electrode 21, an insulting FPC (flexible printed circuit board) 22, a second electrode 23, a piezoelectric film 24, and a conductive thin film member 25.

Figure 6A:
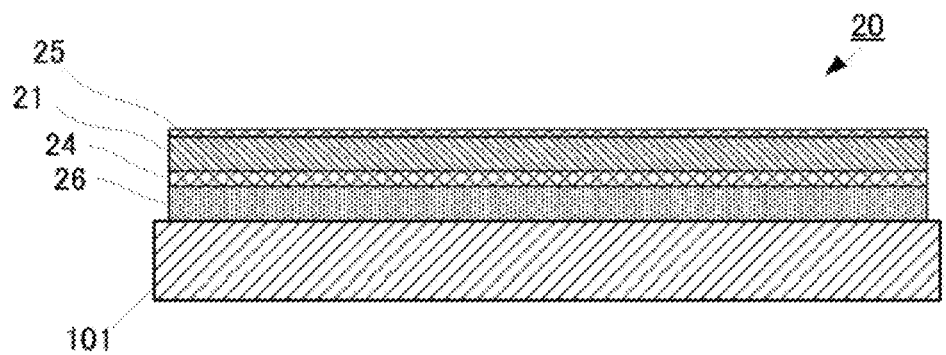
FIG. 6A is a cross-sectional view of the piezoelectric film sensor.
Figure 6B:
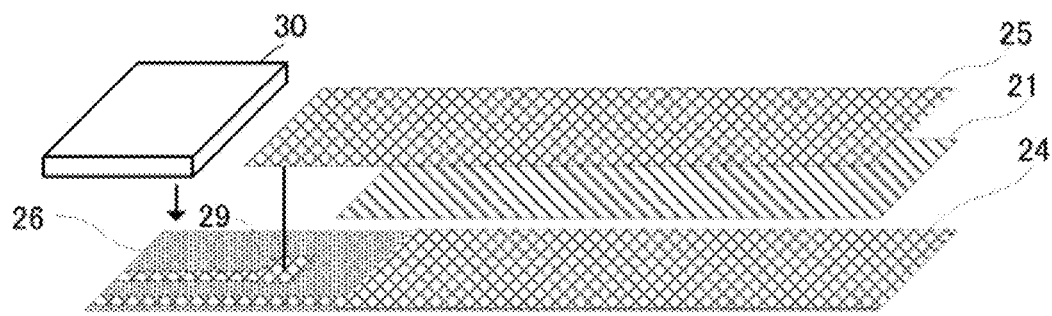
FIG. 6B is an exploded perspective view.

The first and second electrodes 21 and 23 are formed on opposing main surfaces of the FPC 22 in advance, respectively. The second electrode 23, which functions as a shield conductor, is coupled to the housing 101 via an adhesive or the like. As shown in FIG. 6(A), for example, when the housing 101 is a metal member and functions as a shield conductor, the second electrode 23 may be omitted. Although not shown in FIG. 2, the conductive thin film member 25 and the second electrode 23 are preferably patterned on the lower surface side of the FPC 22 so as not to short-circuit and to be electrically connected to a third electrode 29. In addition, for example, the piezoelectric film 24 and the FPC 22 are applied with a pressure-sensitive adhesive sheet or the like, but these are not shown.

The FPC 22 is an insulating substrate having flexibility, such as polyimide, PET, or liquid crystal polymer. The second electrode 23 is formed on the lower surface side (the housing 101 side) of an FPC 26. The first electrode 21 is formed on the upper surface side of the FPC 22. The first electrode 21 functions as a signal electrode for detecting an electric charge generated in the piezoelectric film 24. The first electrode 21 preferably extends along the longitudinal direction (horizontally in FIG. 2(A)) of the FPC 22 and is electrically connected to the detection section 30 shown in FIG. 2(B). The first electrode 21 and the conductive thin film member 25 are also connected to the detection section (ground section) 30.

A lower surface (first main surface) of the piezoelectric film 24 is applied onto an upper surface of the first electrode 21. The conductive thin film member 25 is applied onto an upper surface (second main surface) of the piezoelectric film 24. The conductive thin film member 25 is electrically connected to a third electrode 29 (FIG. 2(B)) formed on the upper surface of the FPC 22. The third electrode 29 extends along the longitudinal direction of the FPC 22 and is electrically connected to the detection section 30.

The conductive thin film member 25 functions as a shield conductor and is typically coupled to ground. According to such a structure, both the signal electrode (e.g., the first electrode 21) and the ground electrode (e.g., the conductive thin film member 25) can be taken out from the upper surface (the same surface) of the FPC 22, which facilitates mounting. It is preferable that the upper surface of the conductive thin film member 25 is further covered with, and protected by, a PET film or the like.

The conductive thin film member 25 may be, for example, a conductive nonwoven fabric having an adhesive formed thereon or a copper foil impregnated with a resin on which an adhesive is formed. The conductive thin film member 25 preferably covers both the piezoelectric film 24 and the third electrode 29 (see FIGS. 2(B) and 2(C)). However, it does not have to cover the entire conductive thin film member 25. It is sufficient to cover at least a part of the conductive three film members 25. The conductive thin film member 25 preferably has a lower rigidity than the first and second electrodes 21 and 23 so as not to hinder deformation of the piezoelectric film.

For example, when the first and second electrodes 21 and 23 are formed of a copper foil having an elastic modulus of about $1.0 \times 10^9$ Pa and the conductive thin film member 25 is formed of a conductive nonwoven fabric having an elastic modulus of about $1.0 \times 10^5$ Pa to about $1.0 \times 10^6$ Pa, deformation due to pressing from an outer peripheral side surface of the housing 101, which acts as a pressing surface, is easily transmitted to the piezoelectric film 24 and deformation of the piezoelectric film 24 is not hindered. On the other hand, even when the conductive thin film member 25, the first electrode 21, and the second electrode 23 are formed of the same material, if the thickness of the conductive thin film member 25 is made thinner than the thicknesses of the first electrode 21 and the second electrode 23, the deformation of the piezoelectric film 24 is not hindered.

The piezoelectric film 24 is preferably formed of a piezoelectric material which generates an electric charge on its opposing main surfaces in response to expansion and contraction of the flat film. For example, a chiral polymer may be used for the piezoelectric film 24. More preferably, uniaxially stretched polylactic acid (PLA), more specifically L-type polylactic acid (PLLA) is used for the piezoelectric film 24. The uniaxial stretching direction of the polylactic acid is a direction forming approximately 45° with respect to a longitudinal direction of the piezoelectric film (in the example of FIG. 1, the circumferential direction along the inner surface wall of the housing 101). Although it is most preferable that this formed angle is 45°, it may be within the range of about ±10°.

The chiral polymer has piezoelectricity when the main chain has a helical structure and the molecules are oriented by uniaxially stretching. In the chiral polymer, since the piezoelectricity is generated by orientation treatment of the molecules by stretching or the like, there is no need to perform poling treatment unlike other polymers such as PVDF or piezoelectric ceramics. In particular, since polylactic acid has no pyroelectricity, even when an operator grips an electronic pen and heat from user's fingers or the like is transmitted, an amount of electric charge detected does not change. A piezoelectric constant of uniaxially stretched PLLA falls into a category of extremely high piezoelectric constant in polymers. For example, a high value of 10 to 20 pC/N can be obtained for a piezoelectric strain constant d14 of PLLA by adjusting conditions such as stretching conditions, heat treatment conditions, and blending of additives. The piezoelectric constant of PLLA does not fluctuate over time and is extremely stable.

Preferably a stretching ratio of the piezoelectric film ranges from about 3 times to about 8 times. When a heat treatment is performed after the stretching, crystallization of an extended chain crystal of polylactic acid is promoted to improve the piezoelectric constant. For biaxial stretching, an effect similar to that of the uniaxial stretching can be obtained by varying the stretching ratio in each axis. For example, in the case where stretching is performed in a certain direction that is defined as an X-axis direction by eight times, and stretching is performed in a Y-axis direction that is orthogonal to the X axis by two times, a substantially similar effect to the case where uniaxial stretching is performed in the X-axis direction by about four times can be obtained for the piezoelectric constant. Since the simply uniaxially-stretched piezoelectric film is likely to tear along a stretching axis direction, strength can be increased to a certain degree by biaxial stretching as described above.

Of course, the piezoelectric film of the present invention can be achieved even with PVDF.

Figure 4:
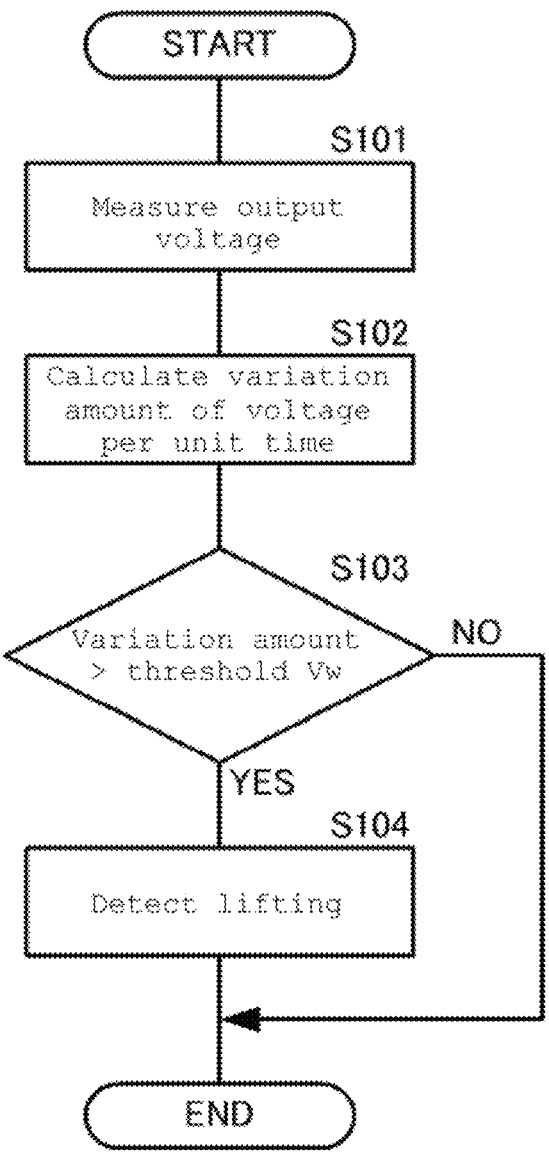
FIG. 4 is a flowchart showing a flow for detecting holding in the electronic pen.

Next, FIG. 4 is a flowchart showing a flow for detecting the fact that the electronic pen 10 is being held by a user. Although this operation is preferably performed in the detection section 30, it can alternatively be performed in the function module 501.

First, the detection section 30 observes an output voltage of the piezoelectric sensor 20 (S101). The detection section 30 calculates a variation amount of the output voltage per unit time set (i.e., the rate of change of the output voltage). The unit of set time is preferably selected in advance (S102). The variation amount is, for example, a difference between a maximum voltage and a minimum voltage within a unit time.

The detection section 30 compares the variation amount with a threshold voltage Vw. When the detection section 30 detects that the variation amount is greater than the threshold voltage Vw (S103: YES), the detection section 30 determines that the housing 101 is being held (e.g., lifted) and detects a "held" state (S104).

On the other hand, if the variation amount is equal to or less than the threshold voltage Vw (S103: NO), the detection section 30 determines that the housing 101 is not being held. Then, the detection section 30 continues to measure the output voltage (i.e., returns to step S101), calculates the variation amount per unit time, and compares the variation amount with the threshold value. This process is reported. Thus, the electronic pen 10 can detect whether or not the housing 101 is held and functions as a holding state detection device.

Figure 5:
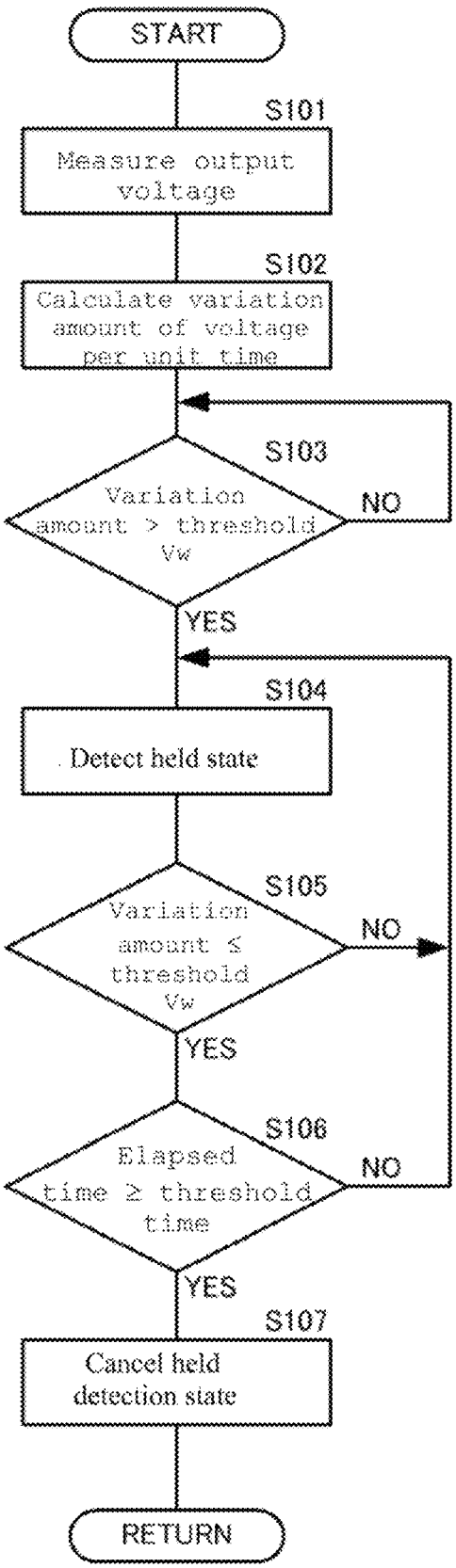
FIG. 5 is a flowchart showing a flow for detecting a holding state in the electronic pen.

By executing the flow shown in FIG. 5, the detection section 30 can also detect when the housing 101 is held. In FIG. 5, the flow up to step S104 is the same as the example shown in FIG. 4, and a description thereof will be omitted.

In this embodiment, the detection section 30 continues to compare the variation amount with the threshold voltage Vw and continues to determine that the housing 101 is in a held state as long as the variation amount remains greater than the threshold Vw (i.e., does not become equal to or less than the threshold voltage Vw). (S105: NO).

When the detection section 30 detects that the variation amount is equal to or less than the threshold voltage Vw (S105: YES), the detection section 30 starts clocking and measures, as an elapsed time, the time period in which the variation amount is equal to or less than the threshold voltage Vw. During the period in which the elapsed time is shorter than a threshold time (S106: NO), the detection section 30 continues to determine that the housing 101 is being held.

When the elapsed time reaches the threshold time, the detection section 30 determines (identifies) that the housing 101 is no longer being held and cancels the "held" detection state (S107). In this manner, the detection section 30 can detect the holding state of the housing 101 (i.e., whether or not the housing 101 is held).

By using an average voltage in a period (initial state) in which the housing 101 is not held as a reference voltage, the detection section 30 may set the threshold value Va. For example, the threshold value Va may be set to a value equal to the difference between either the minimum or maximum voltages during the initial state and the reference voltage within a measurement unit time. With such a configuration, it is possible to accurately and reliably detect that the housing 101 is held by the operator.

In particular, in the piezoelectric sensor 20 of the present embodiment, since the piezoelectric sensor 20 is applied onto the inner wall surface of the housing 101, the pressing direction is determined on the FPC 22 side, the first electrode 21 side, and the second electrode 23 side. Accordingly, in the piezoelectric sensor 20, the thickness of the conductive thin film member 25 is made thinner than the thicknesses of the FPC 22, the first electrode 21 and the second electrode 23, or the elastic modulus is decreased, so that the deformation due to the pressing from the pressing surface is easily transmitted to the piezoelectric film 24, and, at the same time, the deformation of the piezoelectric film 24 is not hindered.

When a piezoelectric film sensor of the present invention is incorporated in an electronic pen, a battery built in the electronic pen can last longer. Further, a structure of the piezoelectric film sensor of the present invention is not limited to an electronic pen, and the piezoelectric film sensor can, for example, be used for a wireless communication device incorporating a battery (or other power source), such as a smart phone, a remote controller, or a wireless mouse. Because the piezoelectric film sensor is flexible, it can be applied onto curved and bent portions and therefore it is effective for device miniaturization.

Figure 7:
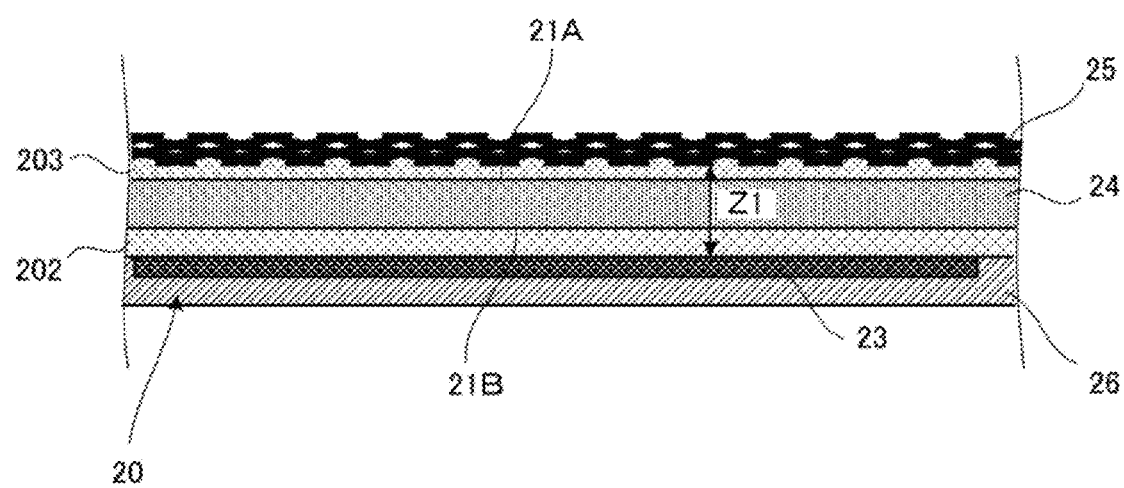
FIG. 7 is a cross-sectional view of a piezoelectric sensor 20.
Figure 8:
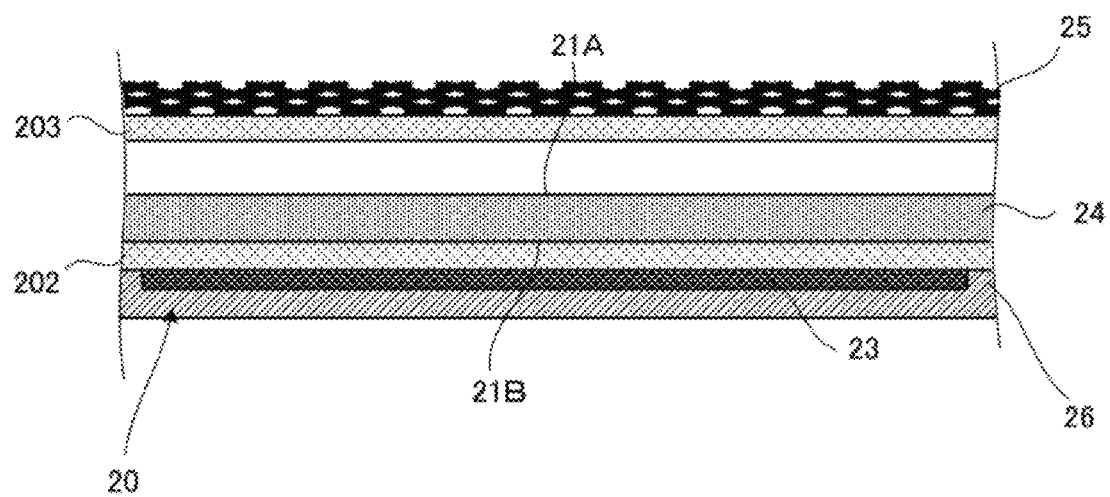
FIG. 8 is a cross-sectional view before application of a piezoelectric film 24 and a conductive thin film member 25 included in the piezoelectric sensor 20.

Next, FIG. 7 is a cross-sectional view of the piezoelectric sensor 20 in a modified example. FIG. 8 is a cross-sectional view before application of the piezoelectric film 24 and the conductive thin film member 25 included in the piezoelectric sensor 20 in the modified example.

The piezoelectric sensor 20 includes the conductive thin film member 25, a first adhesive 203, the piezoelectric film 24, a second adhesive 202, and the FPC 26.

The conductive thin film member 25 corresponds to an example of a first electrode member. The piezoelectric film 24 corresponds to an example of a piezoelectric body.

The piezoelectric film 24 has first and second opposed main surfaces 21A and 21B. The second adhesive 202 is coated on the second main surface 21B. The FPC 26 is applied onto the second main surface 21B of the piezoelectric film 24 via the second adhesive 202.

The first adhesive 203 is coated on the first main surface 21A of the piezoelectric film 24 and the conductive thin film member 25 is applied onto the first main surface 21A via the first adhesive 203 by pressing the conductive thin film member toward the piezoelectric film 24 at a predetermined temperature. As a result, as shown in FIGS. 7 and 8, the first adhesive 203 penetrates into the conductive thin film member 25. The conductive thin film member 25 and the second electrode 23 are electrically connected to the detection section 30.

The piezoelectric film 24 is preferably formed of PLLA (L-type polylactic acid). Thus, for example, when the piezoelectric film 24 expands/contracts in the longitudinal direction (the horizontal direction in FIG. 8), the piezoelectric film 24 is polarized in the thickness direction (the vertical direction in FIG. 8). Consequently, a voltage is generated between the conductive thin film member 25 and the second electrode 23 in response to deformation of the piezoelectric film member. The piezoelectric sensor 20 outputs its voltage to the detection section 30. The detection section 30 detects the voltage output from the piezoelectric sensor 20 and determines whether or not the housing 101 is held by a user.

Next, the above-described piezoelectric sensor 20 and a piezoelectric sensor 820 according to a comparative example will be compared. First, the configuration of the piezoelectric sensor 820 will be described.

Figure 9:
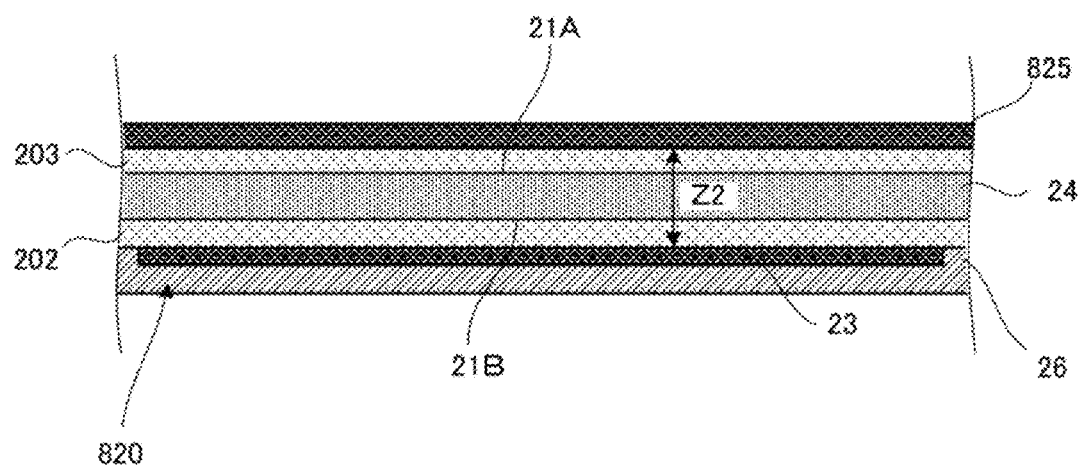
FIG. 9 is a cross-sectional view of a piezoelectric sensor 820.

FIG. 9 is a cross-sectional view of the piezoelectric sensor 820. The piezoelectric sensor 820 is different from the above-described piezoelectric sensor 20 in that it includes a metal sheet 825. The metal sheet 825 is formed of, for example, copper foil, aluminum foil, or the like. Since other configurations are the same, the explanation thereof is herein omitted.

As shown in FIG. 9, an adhesive layer 203 is formed between the metal sheet 825 and the piezoelectric film 24. Thus, in the piezoelectric sensor 820, the distance Z2 between the metal sheet 825 and the second electrode 23 is increased by the thickness of the adhesive layer, similarly to a conventional piezoelectric sensor.

In contrast, in the piezoelectric sensor 20 shown in FIG. 7, since the first adhesive 203 penetrates into the conductive thin film member 25, the distance Z1 between the conductive thin film member 25 and the second electrode 23 is short (compared to the embodiment of FIG. 9). Accordingly, the detection sensitivity of the piezoelectric sensor 20 is greater than that of the conventional piezoelectric sensor, including the piezoelectric sensor 820.

The elastic modulus of a metal nonwoven fabric constituting the conductive thin film member 25 is preferably lower than the elastic modulus of the piezoelectric film 24. Thus, the conductive thin film member 25 does not hinder the movement of the piezoelectric film 24. Accordingly, the detection sensitivity of the piezoelectric sensor 20 can be further enhanced.

Further, the conductive thin film member 25 preferably has a fibrous structure. Thus, in the piezoelectric sensor 20, when the first adhesive 203 penetrates into the conductive thin film member 25, peeling at an interface can be alleviated by the anchor effect.

At least a portion of the conductive thin film member 25 is preferably in contact with the first main surface 21A of the piezoelectric film 24. In this case, at least a portion of the conductive thin film member 25 is closest to the piezoelectric film 24. In this case, the detection sensitivity of the piezoelectric sensor 20 can be further enhanced.

Figure 10:
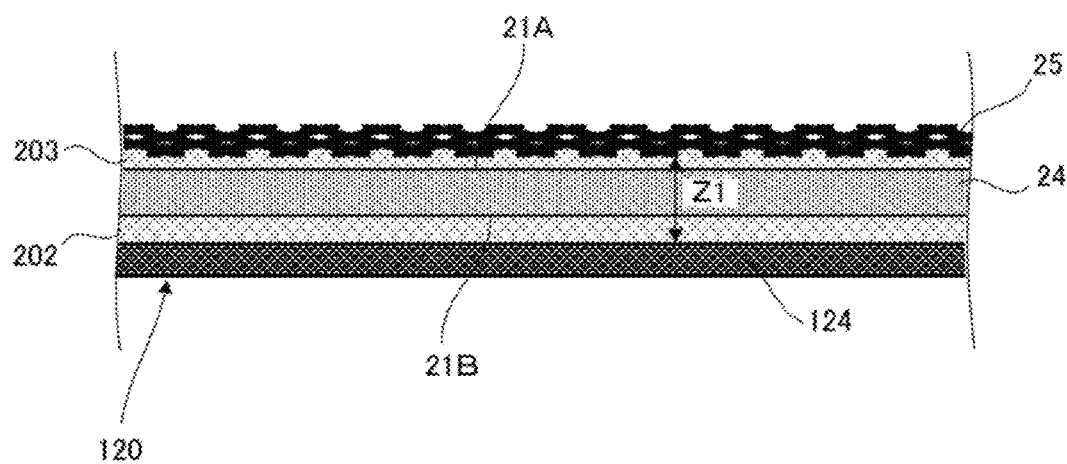
FIG. 10 is a cross-sectional view of a piezoelectric sensor 120.

In the present embodiment, the FPC 26 formed with the second electrode 23 is applied onto the second main surface 21B of the piezoelectric film 24 via the second adhesive 202, but this is not necessary. For example, as shown in FIG. 10, instead of the FPC 26, a metal sheet 124 may be applied onto the second main surface 21B of the piezoelectric film 24 via the second adhesive 202. The metal sheet 124 is formed of, for example, copper foil, aluminum foil, or the like.

Next, a piezoelectric sensor 220 will be described with reference to the drawings.

Figure 11:
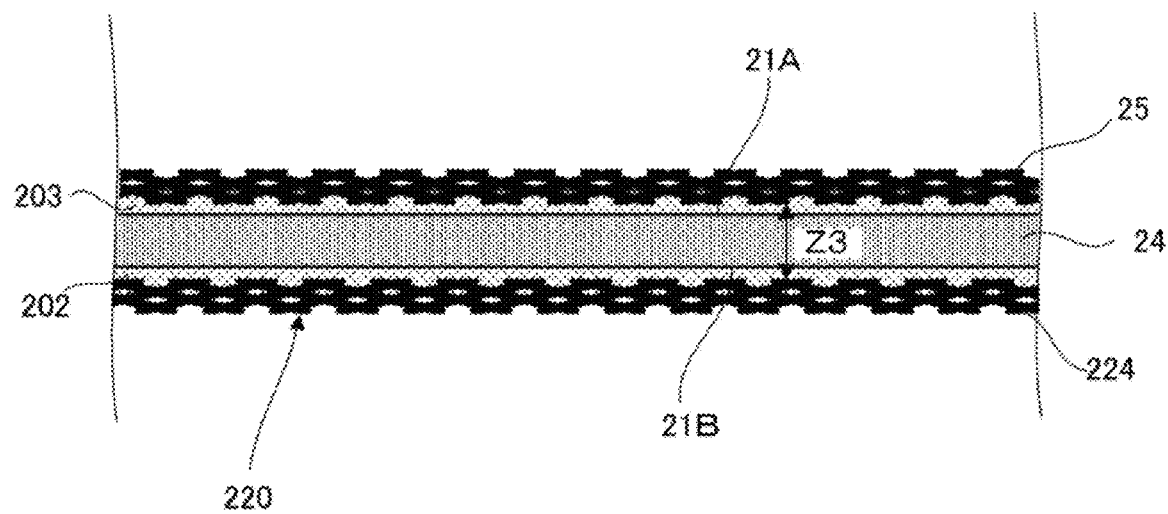
FIG. 11 is a cross-sectional view of a piezoelectric sensor 220.

FIG. 11 is a cross-sectional view of the piezoelectric sensor 220 according to the second embodiment of the present invention. The piezoelectric sensor 220 is different from the piezoelectric sensor 20 of the first embodiment in that a metal nonwoven fabric 224 is provided instead of the FPC 26. The metal nonwoven fabric 224 corresponds to an example of a second electrode member.

The metal nonwoven fabric 224 is applied onto the second main surface 21B via the second adhesive 202 by pressing the metal nonwoven fabric toward the piezoelectric film 24 at a predetermined temperature. As a result, the second adhesive 202 penetrates into the metal nonwoven fabric 224. Since other configurations are the same, the explanation thereof is herein omitted.

In the piezoelectric sensor 220, as shown in FIG. 11, the second adhesive 202 penetrates into the metal nonwoven fabric 224. Thus, a distance Z3 between the conductive thin film member 25 and the metal nonwoven fabric 224 is further reduced (compared to the prior embodiments).

The elastic modulus of a metal nonwoven fabric constituting the metal nonwoven fabric 224 is preferably lower than the elastic modulus of the piezoelectric film 24. Thus, the metal nonwoven fabric 224 does not hinder the movement of the piezoelectric film 24.

Accordingly, the detection sensitivity of the piezoelectric sensor 220 can be made higher than that of the above-described piezoelectric sensor 20.

Further, the metal nonwoven fabric 224 preferably has a fibrous structure. Thus, in the piezoelectric sensor 220, when the second adhesive 202 penetrates into metal nonwoven fabric 224, peeling at an interface can be alleviated by the anchor effect.

Figure 12:
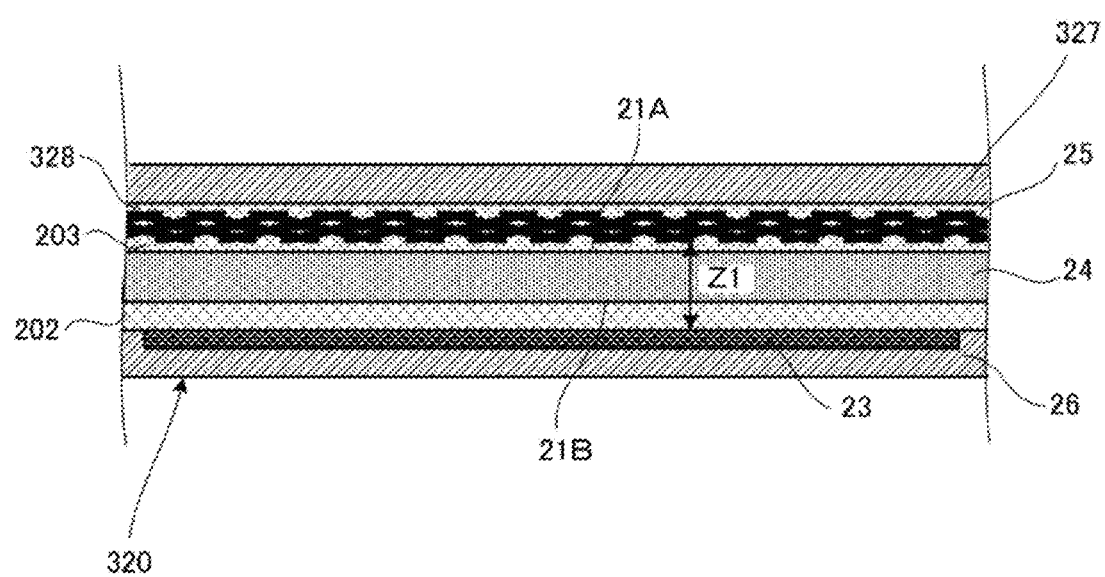
FIG. 12 is a cross-sectional view of a piezoelectric sensor 320.

Next, FIG. 12 is a cross-sectional view of a piezoelectric sensor 320. The piezoelectric sensor 320 is different from the piezoelectric sensor 20 in that a third adhesive 328 and a substrate 327 are provided. The substrate 327 is formed of, for example, a PET film. The substrate 327 faces the conductive thin film member 25. The third adhesive 328 is coated onto the substrate 327. Both the first adhesive 203 and the third adhesive 328 penetrate into the conductive thin film member 25. The first adhesive 203 and the third adhesive 328 are connected in the conductive thin film member 25. Since other configurations are the same, the explanation thereof is herein omitted.

In the piezoelectric sensor 20, as shown in FIG. 7, when a pressing force is applied to the conductive thin film member 25, the pressing force is not easily transmitted to the piezoelectric film 24 due to the deformation of the conductive thin film member 25 itself.

In contrast, in the piezoelectric sensor 320, a surface of the substrate 327 is pressed toward the piezoelectric film 24 at a predetermined temperature with the result that the first and third adhesives 203 and 328 are connected in the conductive thin film member 25 and partially bonded. Accordingly, the piezoelectric sensor 320 can further improve adhesive strength of the substrate 327, the conductive thin film member 25, and the piezoelectric film 24.

In the piezoelectric sensor 320, as shown in FIG. 12, the first adhesive 203 penetrates into the conductive thin film member 25. As a result, a distance Z1 between the conductive thin film member 25 and the second electrode 23 is short. Accordingly, the detection sensitivity of the piezoelectric sensor 320 can be made higher than that of the conventional piezoelectric sensor, similarly to the piezoelectric sensor 20 of the first embodiment.

The elastic modulus of a metal nonwoven fabric constituting the conductive thin film member 25 is preferably lower than the elastic modulus of the piezoelectric film 24. As a result, the conductive thin film member 25 does not significantly hinder the deformation of the piezoelectric film 24. Accordingly, the detection sensitivity of the piezoelectric sensor 320 can be further enhanced.

Further, the conductive thin film member 25 preferably has a fibrous structure. Thus, in the piezoelectric sensor 320, when the first adhesive 203 penetrates into the conductive thin film member 25, peeling at an interface can be alleviated by the anchor effect.

Figure 13:
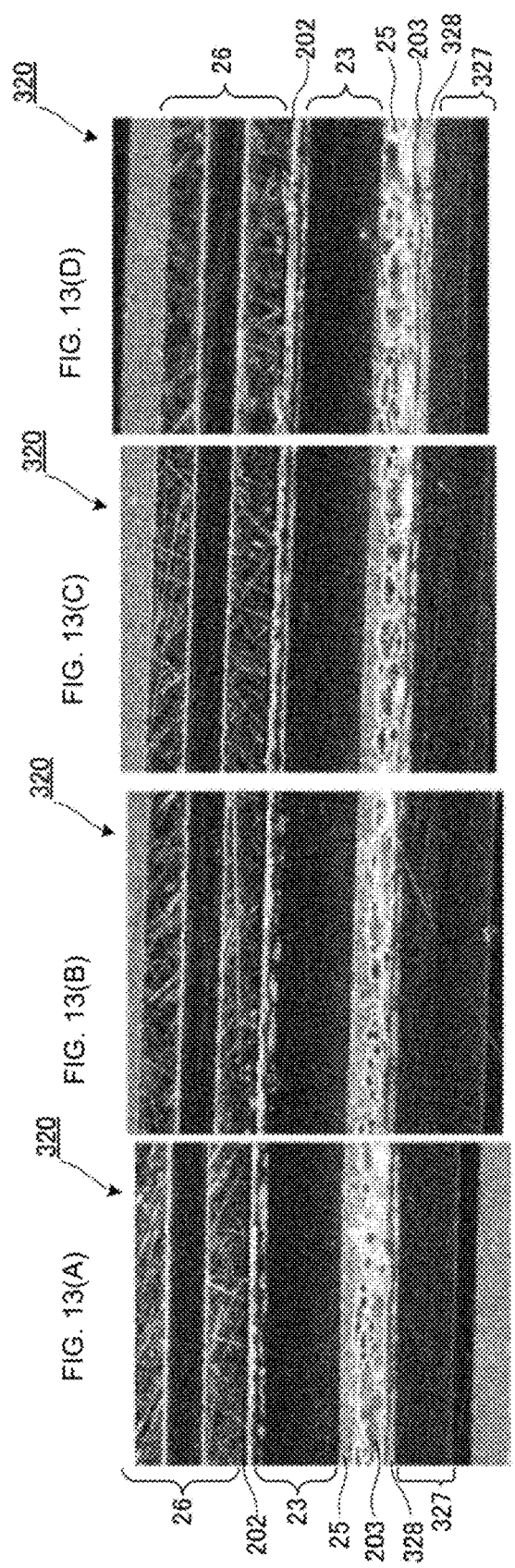
FIG. 13A is a cross-sectional view of the piezoelectric sensor 320 in a state where the piezoelectric film 24 and the conductive thin film member 25 are applied.
FIGS. 13B to 13D are cross-sectional views of the piezoelectric sensor 320 in a state where the piezoelectric film 24 and the conductive thin film member 25 are applied and then pressed.

FIG. 13A is a cross-sectional view of the piezoelectric sensor 320 in a state where the piezoelectric film 24 and the conductive thin film member 25 are applied. FIG. 13B is a cross-sectional view of the piezoelectric sensor 320 in a state where the piezoelectric film 24 and the conductive thin film member 25 are applied and then pressed against each other at 64° C. FIG. 13C is a cross-sectional view of the piezoelectric sensor 320 in a state where the piezoelectric film 24 and the conductive thin film member 25 are applied and then pressed against each other at 108° C. FIG. 13D is a cross-sectional view of the piezoelectric sensor 320 in a state where the piezoelectric film 24 and the conductive thin film member 25 are applied and then pressed against each other at 140° C.

FIGS. 13B to 13D show cross sections after heating the piezoelectric sensor 320 using a silicone rubber heater with a thickness of 1 mm and pressing the piezoelectric sensor 320 at 0.33 MPa for 10 seconds.

From FIGS. 13A to 13D, it has been found that a distance between the FPC 26 and the conductive thin film member 25 becomes shorter as the pressing temperature increases. The reason for this result is believed to be that the fluidity of the first adhesive 203 increases as the pressing temperature increases. The pressing temperature needs to be less than a melting temperature of the piezoelectric film 24.

Figure 14:
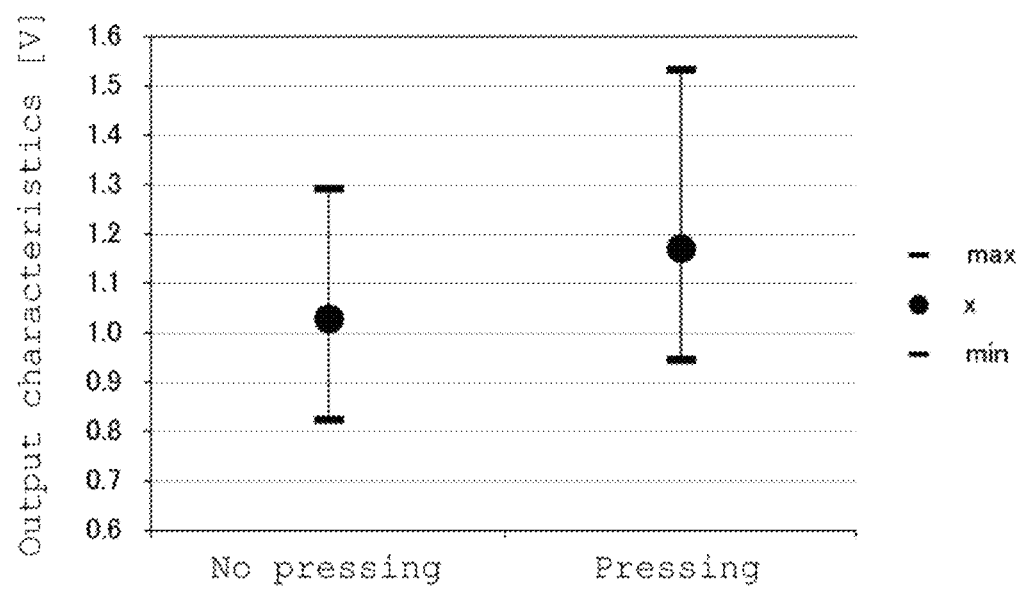
FIG. 14 is a diagram comparing output characteristics of the pressed piezoelectric sensor 320 and the unpressed piezoelectric sensor 320.

The output characteristics of the pressed piezoelectric sensor 320 and output characteristics of the unpressed piezoelectric sensor 320 shown in FIG. 13A were compared with each other. FIG. 14 is a diagram comparing the output characteristics of the pressed (and heated) piezoelectric sensor 320 and the unpressed piezoelectric sensor 320. In FIG. 14, the piezoelectric sensor 320 in which the surface of the substrate 327 is pressed toward the piezoelectric film 24 at 100° C. and the unpressed piezoelectric sensor 320 shown in FIG. 13A are prepared, and there are shown experimental results obtained by measuring voltage values output from the respective piezoelectric sensors 320 a plurality of times.

Experiments have revealed that the unpressed piezoelectric sensor 320 outputs a voltage of 1.02 V on average in the range between 0.82 V and 1.3 V. In contrast, it has been found that the pressed piezoelectric sensor 320 outputs a voltage of 1.18 V on average in the range between 0.95 V and 1.53 V. In other words, it has been found that the output characteristics of the pressed piezoelectric sensor 320 are improved by about 14% compared with the output characteristics of the unpressed piezoelectric sensor 320. The reason for this result is believed to be that the first adhesive 203 penetrates into the conductive thin film member 25 by pressing and the distance Z1 between the conductive thin film member 25 and the second electrode 23 is reduced.

Figure 15:
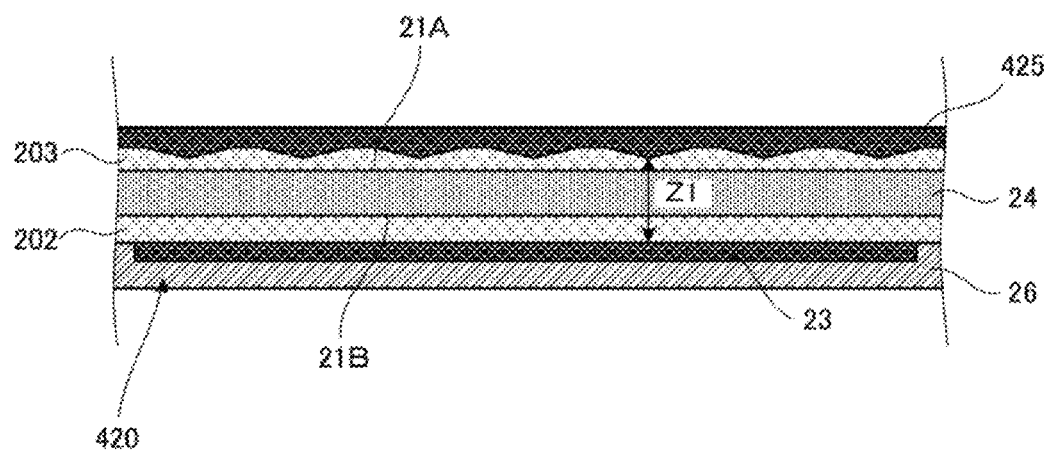
FIG. 15 is a cross-sectional view of a piezoelectric sensor 420.

Next, FIG. 15 is a cross-sectional view of a piezoelectric sensor 420. The piezoelectric sensor 420 is different from the piezoelectric sensor 20 in that a concavo-convex member 425 is provided instead of the conductive thin film member 25. A main surface of the concavo-convex member 425 on the piezoelectric film 24 side has a concavo-convex shape and has a plurality of recesses. The concavo-convex member 425 is preferably formed of a metal such as copper. The concavo-convex member 425 corresponds to an example of the first electrode member.

In the piezoelectric sensor 420, as shown in FIG. 15, the first adhesive 203 penetrates into the plurality of recesses of the concavo-convex member 425. Thus, a distance Z1 between the concavo-convex member 425 and the second electrode 23 is short. Accordingly, the detection sensitivity of the piezoelectric sensor 420 can be made higher than that of the conventional piezoelectric sensor, similarly to the piezoelectric sensor 20.

Figure 16:
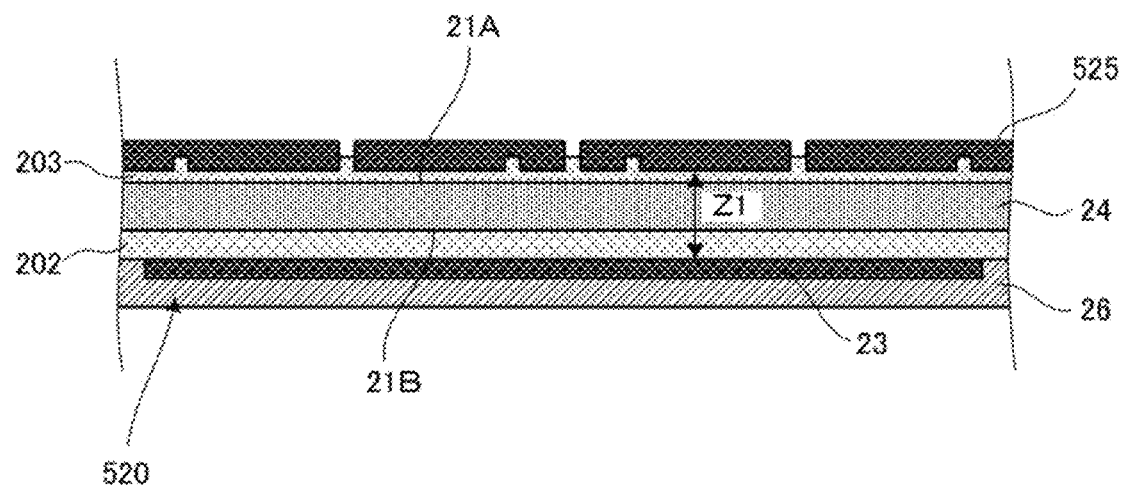
FIG. 16 is a cross-sectional view of a piezoelectric sensor 520.

Next, FIG. 16 is a cross-sectional view of a piezoelectric sensor 520. The piezoelectric sensor 520 is different from the piezoelectric sensor 20 in that a porous member 525 is provided instead of the conductive thin film member 25. A main surface of the porous member 525 on the piezoelectric film 24 side has a plurality of recesses. The porous member 525 is formed of a metal such as copper. The porous member 525 corresponds to an example of the first electrode member.

In the piezoelectric sensor 520, as shown in FIG. 16, the first adhesive 203 penetrates into a plurality of holes of the porous member 525. Thus, a distance Z1 between the porous member 525 and the second electrode 23 is short. Accordingly, the detection sensitivity of the piezoelectric sensor 520 can be made higher than that of the conventional piezoelectric sensor, similarly to the piezoelectric sensor 20.

In the above-described embodiment, the electronic pen 10 is shown as an example of an electronic device in which a curved substrate is mounted in a housing, but the invention is not limited to the use. In implementation, the present invention can be applied to other electronic devices such as a mouse, a tablet terminal, and a smart phone.

Although the detection section 30 is mounted inside the housing 101, the invention is not so limited. For example, the detection section 30 may be disposed outside the housing 101. In a mode in which the detection section 30 is disposed outside the housing 101, the piezoelectric sensor 20 and the detection section 30 may be wired or wirelessly connected.

In the above-described embodiments, the piezoelectric film 24 formed of polylactic acid is preferably used for each of the piezoelectric sensors 20, 120, 220, 320, 420, and 520. However, other piezoelectric films such as PVDF may be used.

Finally, the description of the above embodiments is to be considered in all respects as illustrative and not limiting. The scope of the present disclosure is indicated by the appended claims rather than by the above embodiments, and all changes which come within the meaning and range of equivalency of the claims are intended to be embraced therein.

DESCRIPTION OF REFERENCE SYMBOLS

10: Electronic pen
20: Piezoelectric sensor
21: First electrode
21A: First main surface
21B: Second main surface
22: FPC
23: Second electrode
24: Piezoelectric film
25: Conductive thin film member
26: FPC
29: Third electrode
30: Detection section
101: Housing
102: End portion
120: Piezoelectric sensor
124: Metal sheet
202: Second adhesive
203: First adhesive
220: Piezoelectric sensor
224: Metal nonwoven fabric
320: Piezoelectric sensor
327: Substrate
328: Third adhesive
420: Piezoelectric sensor
425: Concavo-convex member
501: Function module
520: Piezoelectric sensor
525: Porous member
820: Piezoelectric sensor
825: Metal sheet

The invention claimed is:

1. A piezoelectric film sensor comprising:
an insulating substrate having first and second opposed main surfaces;
a first electrode provided on the first main surface of the insulating substrate;
a piezoelectric film having first and second opposed main surfaces, the first main surface of the piezoelectric film facing the first electrode; and
a conductive thin film member provided on the second main surface of the piezoelectric film;
wherein the insulating substrate and the first electrode have elastic moduli higher than the elastic modulus of the conductive thin film member.

2. A holding state detecting device comprising:
(a) a cylindrical housing;
(b) a piezoelectric film sensor coupled to an inner wall surface of the housing, the piezoelectric sensor including:
(i) an insulating substrate having first and second opposed main surfaces;
(ii) a first electrode provided on the first main surface of the insulating substrate,
(iii) a piezoelectric film having first and second opposed main surfaces, the first main surface of the piezoelectric film facing the first electrode, and
(iv) a conductive thin film member provided on the second main surface of the piezoelectric film; and
(c) a detection section which determines whether the housing is held by a user based on a variation amount of an output voltage of the piezoelectric film sensor.

3. The holding state device according to claim 2, wherein the detection section determines whether the housing is held by a user by calculating a variation amount of the output voltage per unit time and compares the variation amount to a threshold value.

4. The holding state device according to claim 3, wherein, after the detection section determines that the housing is held by a user, the detection section further determines that the housing is no longer held by the user when the variation amount of the output voltage per unit time falls below the threshold level for more than a predetermined period of time.

5. A piezoelectric film sensor, comprising:
an insulating substrate having a main surface;
a porous conductive film having first and second opposed surfaces, the first surface of the porous conductive film being coupled to the main surface of the insulating substrate by a first adhesive that penetrates the first surface of the porous conductive film;
a piezoelectric film having first and second opposed surfaces, the first surface of the of the piezoelectric film being coupled to the second surface of the porous conductive film by a second adhesive which penetrates the porous conductive film such that the first and second adhesives are connected in the porous conductive film.

6. The piezoelectric film sensor according to claim 5, wherein the porous conductive film is a metal nonwoven fabric.

7. The piezoelectric film sensor according to claim 5, wherein at least a portion of the porous conductive film is in contact with the first surface of the piezoelectric film.

8. The piezoelectric film sensor according to claim 5, wherein an electrode is formed on the second surface of the piezoelectric film.

9. The piezoelectric film sensor according to claim 8, wherein the porous conductive film is electrically connected to the electrode.

10. The piezoelectric film sensor according to claim 5, wherein the piezoelectric film comprises polylactic acid stretched in a uniaxial direction.

11. The piezoelectric film sensor according to claim 5, further comprising an electrode coupled to the second surface of the piezoelectric film by a third adhesive.

12. A holding state detecting device comprising:
(a) a cylindrical housing;
(b) a piezoelectric film sensor coupled to an inner wall surface of the housing, the piezoelectric film sensor including:
(i) an insulating substrate having a main surface;
(ii) a porous conductive film having first and second opposed surfaces, the first surface of the porous conductive film being coupled to the main surface of the insulating substrate by a first adhesive that penetrates the first surface of the porous conductive film; and (iii) a piezoelectric film having first and second opposed surfaces, the first surface of the of the piezoelectric film being coupled to the second surface of the porous conductive film by a second adhesive which penetrates the porous conductive film such that the first and second adhesives are connected in the porous conductive film; and (c) a detection section which determines whether the housing is held by a user based on a variation amount of an output voltage of the piezoelectric film sensor.

13. The holding state device according to claim 12, wherein the detection section determines whether the housing is held by a user by calculating a variation amount of the output voltage per unit time and compares the variation amount to a threshold value.

14. The holding state device according to claim 13, wherein, after the detection section determines that the housing is held by a user, the detection section further determines that the housing is no longer held by the user when the variation amount of the output voltage per unit time falls below the threshold level for more than a predetermined period of time.

\* \* \* \* \*